United States Patent
Cheng et al.

(10) Patent No.: US 9,530,701 B2
(45) Date of Patent: Dec. 27, 2016

(54) METHOD OF FORMING SEMICONDUCTOR FINS ON SOI SUBSTRATE

(71) Applicant: International Business Machines Corporation, Armonk, NY (US)

(72) Inventors: Kangguo Cheng, Schenectady, NY (US); Joseph Ervin, Wappingers Falls, NY (US); Juntao Li, Cohoes, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/575,602

(22) Filed: Dec. 18, 2014

(65) Prior Publication Data
US 2016/0181164 A1    Jun. 23, 2016

(51) Int. Cl.
*H01L 21/84*     (2006.01)
*H01L 21/311*    (2006.01)
*H01L 29/66*     (2006.01)
*H01L 21/02*     (2006.01)
*H01L 21/3213*   (2006.01)
*H01L 21/8234*   (2006.01)
*H01L 21/8238*   (2006.01)

(52) U.S. Cl.
CPC ....... *H01L 21/845* (2013.01); *H01L 21/02532* (2013.01); *H01L 21/02546* (2013.01); *H01L 21/02592* (2013.01); *H01L 21/02667* (2013.01); *H01L 21/31111* (2013.01); *H01L 21/32133* (2013.01); *H01L 21/823431* (2013.01); *H01L 21/823468* (2013.01); *H01L 21/823821* (2013.01); *H01L 21/823864* (2013.01); *H01L 29/6653* (2013.01); *H01L 29/6656* (2013.01)

(58) Field of Classification Search
CPC .............. H01L 21/823431; H01L 21/823468; H01L 21/823821; H01L 21/823864; H01L 21/845
See application file for complete search history.

(56) References Cited

U.S. PATENT DOCUMENTS 6,815,738 B2    11/2004    Rim
7,087,506 B2    8/2006     Anderson et al.
(Continued)

*Primary Examiner* — Michael Jung
(74) *Attorney, Agent, or Firm* — Steven J. Meyers; Hoffman Warnick LLC

(57) ABSTRACT

An approach to forming fins for a semiconductor device on a silicon-on-insulator wafer. The approach includes depositing a layer of mandrel material and etching the layer of mandrel material to form a mandrel. The approach includes depositing a layer of a dielectric material on the semiconductor layer and around the mandrel and etching the layer of the dielectric material to form one or more spacers next to the sidewalls of the mandrel, followed by removing the mandrel. Additionally, the approach includes depositing a layer of amorphous semiconductor material around said one or more spacers and heating it to transform into a layer of re-crystallized semiconductor material through solid phase epitaxy. Furthermore, the approach includes removing portions of the layer of re-crystallized semiconductor material from each of the horizontal surfaces of the silicon-on-insulator wafer including the area where the one or more spacers were removed to form one or more fins.

20 Claims, 9 Drawing Sheets

(56) References Cited

U.S. PATENT DOCUMENTS

| | | |
|---|---|---|
| 7,183,152 B1 | 2/2007 | Dakshina-Murthy et al. |
| 7,268,058 B2 | 9/2007 | Chau et al. |
| 7,352,034 B2 | 4/2008 | Booth, Jr. et al. |
| 7,384,830 B2 | 6/2008 | Cohen |
| 7,498,225 B1 | 3/2009 | Wang et al. |
| 7,692,250 B2 | 4/2010 | Booth, Jr. et al. |
| 7,879,660 B2 | 2/2011 | Booth, Jr. et al. |
| 7,960,791 B2 | 6/2011 | Anderson et al. |
| 7,977,706 B2 | 7/2011 | Lochtefeld |
| 8,017,463 B2 | 9/2011 | Chang |
| 8,828,818 B1 * | 9/2014 | Rodder ............ H01L 29/66795 257/E21.182 |
| 9,209,279 B1 * | 12/2015 | Zhang ............... H01L 29/66795 |
| 2005/0048727 A1 | 3/2005 | Maszara et al. |
| 2006/0292772 A1 | 12/2006 | Anderson et al. |
| 2007/0231985 A1 | 10/2007 | Forbes |
| 2012/0097950 A1 * | 4/2012 | Son ...................... H01L 29/785 257/57 |
| 2013/0224936 A1 * | 8/2013 | Lee ................. H01L 21/823821 438/492 |
| 2014/0061793 A1 | 3/2014 | Pei et al. |
| 2014/0170853 A1 * | 6/2014 | Shamma ........... H01L 21/02115 438/699 |
| 2014/0367795 A1 * | 12/2014 | Cai .................... H01L 27/0886 257/392 |

\* cited by examiner

US 9,530,701 B2

METHOD OF FORMING SEMICONDUCTOR FINS ON SOI SUBSTRATE

BACKGROUND OF THE INVENTION

The present invention relates generally to the field of semiconductor technology, and more particularly to the formation of fins used in fin field effect transistor (finFET) devices.

In the manufacture of integrated circuits, there is a continuing desire to fit more semiconductor devices and circuits on semiconductor wafers. The drive for miniaturization and increasing circuit density is driven by a number of factors, including device speed, as denser circuits are closer together for fast communication, wafer utilization (more circuits per wafer) and potential semiconductor chip cost reduction as the number of semiconductor chips per wafer increase.

One manufacturing method for creating wafers and semiconductor chips with the ability to aide in miniaturization is use of silicon-on-insulator (SOI) wafers. SOI wafers provide layers of silicon separated by a buried insulation layer such as silicon dioxide. In addition to providing opportunities for additional wafer real estate, SOI wafers provide the opportunity for improved electrical performance, such as lower parasitic capacitance and reduced resistance to latch up. The semiconductor devices fabricated in the layer of silicon, which is above a layer of electrical insulating material such as SiO2, experience improved semiconductor device isolation and performance. SOI wafers may be created by several processes including oxygen implantation using a high temperature anneal process which may be called Separation by Implantation of Oxygen (SIMOX), Separation by Implantation Of Nitrogen (SIMON), or bonding two wafers together, one of which has an insulating or oxide layer forming a buried oxide layer (BOX) or other dielectric material layer sandwiched between the wafers.

Another method used to increase circuit density on a wafer and improve performance is the development of fin field-effect transistors (finFETs) which utilize three dimensions for device formation. In finFET technology, a thin, vertical fin is used for the conducting channel between the source and drain. The fin is wrapped by a gate creating a wrap-around gate for a channel structure providing better electrical control of the channel and reduced short channel effects. FinFETs may be constructed on a bulk silicon substrate or, in some cases, may be formed on a SOI wafer.

SUMMARY

Embodiments of the present invention provide a method of forming fins for a semiconductor device on a silicon-on-insulator (SOI) wafer. The method includes depositing a layer of mandrel material for a mandrel on a semiconductor layer on the SOI wafer and then, etching the layer of mandrel material to form a mandrel. In addition, the method includes depositing a layer of a dielectric material on the semiconductor layer and around the mandrel. Furthermore, the method includes etching the layer of the dielectric material to form one or more spacers next to the sidewalls of the mandrel and removing the mandrel. Additionally, the method includes depositing a layer of amorphous semiconductor material around said one or more spacers and heating the layer of amorphous semiconductor material to transform into a layer of re-crystallized semiconductor material through solid phase epitaxy. Lastly, the method includes removing portions of the layer of re-crystallized semiconductor material from each of the top surfaces of the one or more spacers followed by removing the semiconductor layer on the SOI wafer from an area where the one or more spacers were removed to form one or more fins of the re-crystallized semiconductor material.

DETAILED DESCRIPTION

Figure 1:
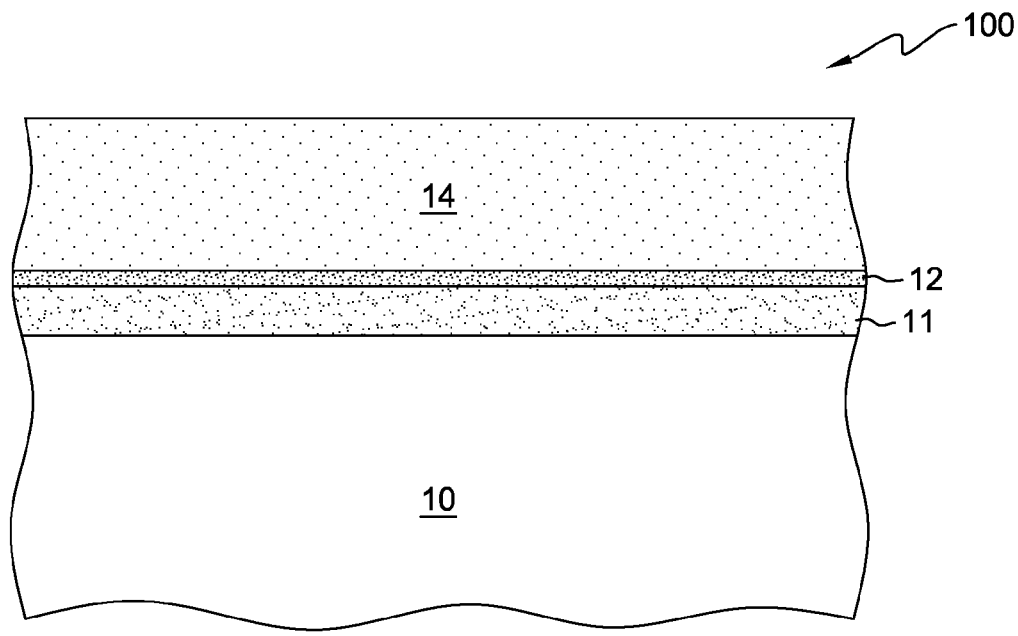
FIG. 1 depicts a cross-sectional view of a structure after depositing a first dielectric material layer on a top surface of a SOI wafer in accordance with an embodiment of the present invention.

Detailed embodiments of the claimed structures and methods are disclosed herein. The method steps described below do not form a complete process flow for manufacturing integrated circuits for semiconductor devices, chips, or wafers. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

Exemplary embodiments will be described more fully herein with reference to the accompanying drawings, in which the exemplary embodiments are shown. In the following detailed description, numerous specific details are set forth in order to provide a thorough understanding of various embodiments of the present invention. However, it is to be understood that embodiments of the present invention may be practiced without these specific details. As such, this invention may be embodied in many different forms and should not be construed as limited to the embodiments set forth herein.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention. As used herein, semiconductor structures refer to one or more physical structures that comprise semiconductor devices, chips or wafers.

Embodiments of the present invention recognize fins for fin FET devices formed on bulk substrates may have high source to drain leakage. Additionally, some processes used to form fins for finFET devices may not provide desired fin uniformity and limited fin density. Embodiments of the present invention recognize that fins may be formed below spacers formed around mandrels using current processes.

Embodiments of the present invention propose methods to create fins for semiconductor devices capable of requiring very little space and small spaces between fins. Embodiments of the present invention provide the capability to form densely packed fins requiring little space between fins by forming fins on both sides of a spacer as opposed to forming fins under a spacer thus, leading to an opportunity for a significant increase in fin density. Additionally, embodiments of the present invention provide fins formed by solid phase epitaxial growth providing material uniformity for fins. Embodiments of the present invention provide fin heights which could be higher than the heights of fins fabricated with a conventional sidewall image transferring (SIT). The methods in embodiments of the present invention create densely packed fins on an electrical insulating layer thus, providing semiconductor devices such as finFET devices improved electrical performance capability. A reduction in source to drain leakage is provided with fin formation on an electrical insulating layer as compared to fin formed in bulk silicon, for example, since the leakage path from source to drain is essentially eliminated.

The present invention will now be described in detail with references to the Figures. FIG. 1 depicts a cross-sectional view of structure 100 after depositing a first dielectric material layer on a top surface of a SOI wafer in accordance with an embodiment of the present invention. As depicted, FIG. 1 includes layer 14 (i.e. the first dielectric layer) and the SOI wafer composed of handling wafer 10, BOX 11, and semiconductor layer 12. Layer 14 is deposited on semiconductor layer 12 of the SOI wafer.

Handling wafer 10 is a semiconductor wafer or a wafer substrate covered with an insulating layer (i.e. BOX 11) used to form a portion of the SOI wafer. In the exemplary embodiment, handling wafer 10 is a single crystal silicon substrate. In another embodiment, handling wafer 10 may be composed of any suitable semiconductor material compatible with the SOI processes and subsequent fin formation. For example, handling wafer 10 may be composed of SiGe, Ge, GaAs, any suitable group IV semiconductor or compound semiconductor material, any suitable group III-V semiconductor material such as alloys of GaAlAs, InGaAs, InAlAs, InAlAsSb, InAlAsP, or InGaAsP, or a group II-VI semiconductor.

BOX 11 is a buried insulating layer over handling wafer 10 on which a finFET device may be formed using semiconductor layer 12. In the exemplary embodiment, the buried insulating layer, which is BOX 11, is composed of silicon dioxide. BOX 11 may be composed of any suitable insulating material used as an insulating material layer between the semiconductor layers of a SOI wafer. For example, BOX 11 may be SiN, another nitride material, another oxide material or any other appropriate material for forming an insulating layer in a SOI wafer. In one embodiment, BOX 11 may be an ultra-thin BOX in the SOI wafer. In another embodiment, BOX (buried oxide) 11 is composed of any suitable dielectric such as silicon dioxide, zinc oxide, silicon nitride, and $Al_2O_3$, but, are not limited to these dielectric materials.

Semiconductor layer 12 is a semiconductor layer in the SOI wafer. Semiconductor layer 12 is on BOX 11. In the exemplary embodiment, semiconductor layer 12 is an ultra-thin semiconductor layer composed of a single crystal silicon substrate. For example, the ultra-thin semiconductor layer thickness may be in the nanometer range which may be a nanometer, or a couple of nanometers to thirty nanometers, however, it is not limited to this thickness range. In an embodiment, semiconductor layer 12 thickness may be less than one nanometer. In one embodiment, semiconductor layer 12 thickness may be greater than thirty nanometers.

In another embodiment, semiconductor layer 12 may be composed of any suitable semiconductor material compatible with the SOI processes and subsequent finFET formation. For example, semiconductor layer 12 may be composed of SiGe, Ge, GaAs, any suitable group IV semiconductor or compound semiconductor material, any suitable group III-V semiconductor material such as alloys of GaAlAs, InGaAs, InAlAs, InAlAsSb, InAlAsP, or InGaAsP, or a group II-VI semiconductor material. Semiconductor layer 12 may be composed of a low defect density semiconductor material suitable for semiconductor device formation which may be a single crystal, an amorphous, or a polycrystalline semiconductor. Semiconductor layer 12 may be doped, undoped or contain doped or undoped regions. In the exemplary embodiment, semiconductor layer 12 is undoped or an intrinsic layer of semiconductor material. In an embodiment, semiconductor layer 12 may be lightly doped (i.e. doping concentrations less than or equal to $10^{17}$ $cm^3$). Semiconductor layer 12 may be strained, unstrained or a combination thereof.

Layer 14 is a first dielectric material layer deposited on the top surface of semiconductor layer 12. In the exemplary embodiment, layer 14 is a first dielectric material which is SiN, but it is not limited to this material. Layer 14 may be any other suitable dielectric material. For example, layer 14 may be silicon dioxide. In an embodiment, layer 14 is composed of another material which is not a dielectric material. Layer 14 composed of SiN is deposited using known deposition methods. For example, chemical vapor deposition (CVD), physical vapor deposition (PVD, atomic layer deposition (ALD), or other suitable deposition process may be used to deposit layer 14. In the exemplary embodiment, the thickness of layer 14 is five to fifty nanometers but, is not limited to this range. In an embodiment, the thickness of layer 14 is greater than fifty nanometers while, in another embodiment, the thickness of layer 14 is less than five nanometers. The thickness of layer 14 may determine the height of the fin of the finFET as formed through later processes.

Figure 2:
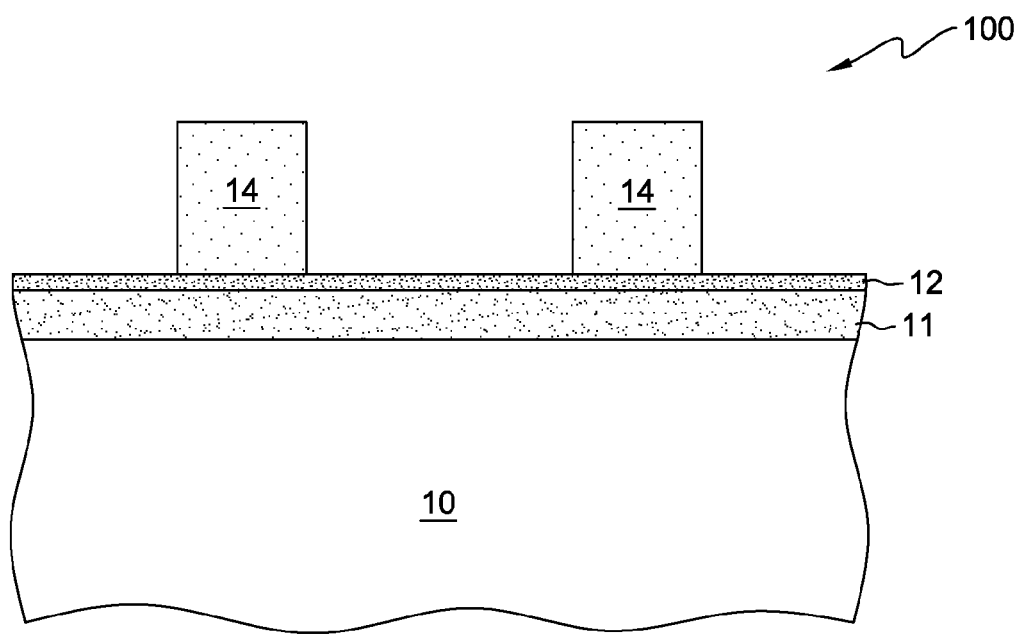
FIG. 2 depicts a cross-sectional view of the structure after a fabrication step to etch the deposited first dielectric material layer following the step illustrated in FIG. 1, in accordance with an embodiment of the present invention.

FIG. 2 depicts a cross-sectional view of structure 100 after fabrication steps to etch the first dielectric material layer in accordance with an embodiment of the present invention. In the exemplary embodiment, the first dielectric layer is a dielectric material such as SiN, but, it is not limited to a dielectric material. As depicted, FIG. 2 includes the elements of FIG. 1 after layer 14 has been etched using standard lithography processes and etch processes such as a wet chemical etch. Layer 14 is etched to form rectangular forms on semiconductor layer 12 however, it should be understood that the embodiments of the present invention are not limited to the number of depicted forms, the spacing of the depicted forms, or the shape of the depicted forms. The spacing, the number of forms, and the shape of the forms created by patterning layer 14 may be determined by a semiconductor device designer based, at least in part, on the limits of the selected lithography and etch processes and desired semiconductor device performance. The spacing of the fins upon completion of the fins as depicted later in FIG. 7 may be determined, in part, by the width of the remaining forms patterned from layer 14. In an embodiment, other processes are used for patterning the form created from layer 14. For example, an electron beam or e-beam etch process may be used. The shape and spacing of the patterned layer 14 creating a form or rectangular structure as depicted in FIG. 2 determines the spacing and height of the fin formed in later processes for the finFET device. The rectangular shapes formed from layer 14 may be closer together than depicted. The closeness or pitch of any adjacent fins created using the patterned layer 14 forms may be determined by the lithography and etch process limits.

Figure 3:
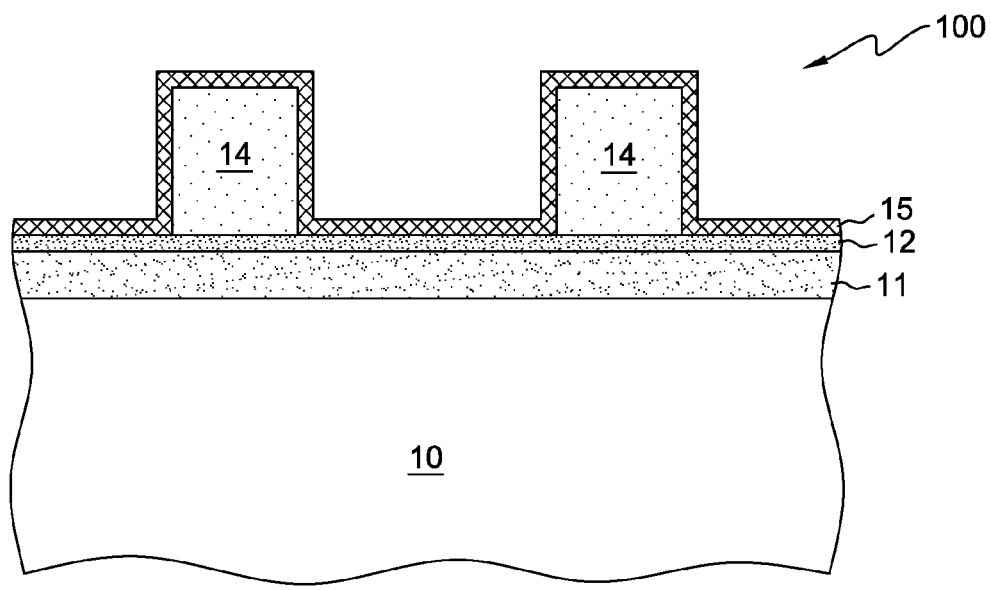
FIG. 3 depicts a cross-sectional view of the structure after a fabrication step to deposit a layer of amorphous silicon and form a layer of re-crystallized silicon following the step illustrated in FIG. 2, in accordance with an embodiment of the present invention.

FIG. 3 depicts a cross-sectional view of structure 100 after fabrication steps to deposit a layer of amorphous silicon and form a layer of re-crystallized silicon in accordance with an embodiment of the present invention. As depicted, FIG. 3 includes the elements of FIG. 2 and a layer of amorphous silicon layer 15, deposited on the top surface of structure 100. In the exemplary embodiment, the thin layer of amorphous silicon, layer 15, is deposited on semiconductor layer 12 and the structures formed or patterned from layer 14. In an embodiment the deposition of layer 15 formed above semiconductor layer 12 adjacent to etched layer 14 may be slightly curved due to the etch process of layer 14. Layer 15 may be deposited by known deposition techniques such as CVD, for example, and may have a thickness in the range of five to fifty nanometers, although a range for amorphous silicon thickness may not be limited to this range. For example, layer 15 could be couple of nanometers thick. In one embodiment, the thickness of layer 15 is greater than fifty nanometers while in another embodiment, the thickness of layer 15 is less than five nanometers.

In another embodiment, layer 15 may be composed of any suitable semiconductor material compatible with the SOI processes and subsequent finFET formation. For example, layer 15 may be composed of SiGe, Ge, GaAs, any suitable group IV semiconductor or compound semiconductor material, any suitable group III-V semiconductor material such as alloys of GaAlAs, InGaAs, InAlAs, InAlAsSb, InAlAsP, or InGaAsP, or a group II-VI semiconductor material. Layer 15 may be doped. In the exemplary embodiment, layer 15 may be an amorphous semiconductor material with the same material composition as layer 14.

Using solid phase epitaxy, layer 15 is re-crystallized to form a layer of re-crystallized silicon. In the exemplary embodiment, layer 15 composed of amorphous silicon is heated and held at a temperature for a period of time to transform the layer of amorphous semiconductor material (i.e. silicon) into a layer of re-crystallized semiconductor material (i.e. re-crystallized silicon) through solid phase epitaxy. For example, structure 100 including layer 15 may be heated to five hundred to six hundred degrees Celsius and held at temperature for ten to thirty minutes. With a solid phase epitaxy, the re-crystallized silicon is created with a lattice structure corresponding to or the same as the lattice structure of semiconductor layer 12 in structure 100. In an embodiment, layer 15 may be composed of another semiconductor material which may be crystallized or re-crystallized using solid phase epitaxy.

Figure 4:
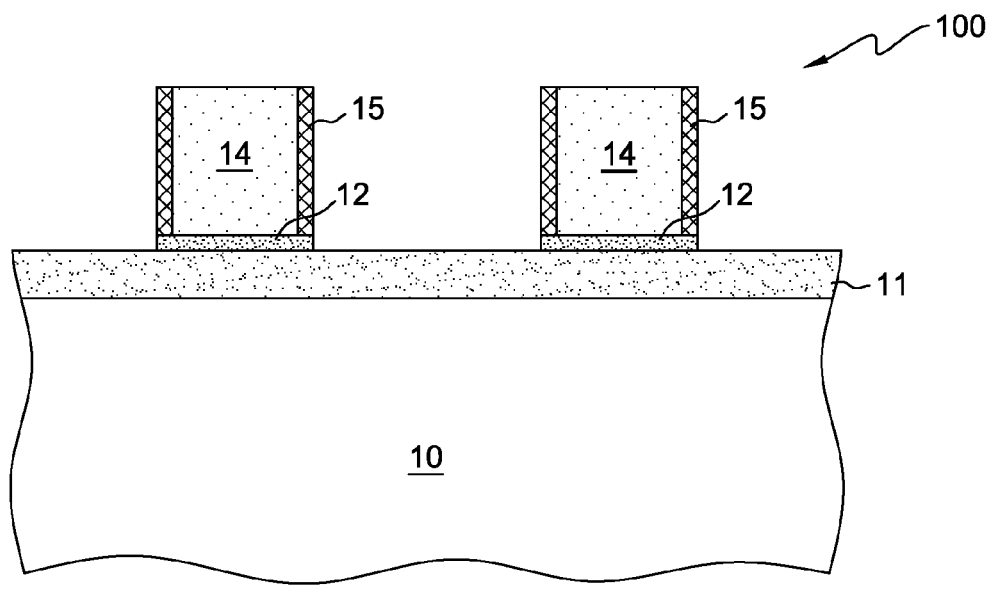
FIG. 4 depicts a cross-sectional view of the structure after a fabrication step to etch the re-crystallized silicon layer following the step illustrated in FIG. 3, in accordance with an embodiment of the present invention.

FIG. 4 depicts a cross-sectional view of structure 100 after fabrication steps to etch the re-crystallized silicon in accordance with an embodiment of the present invention. As depicted, FIG. 4 includes the elements of FIG. 3 except for the horizontal areas of silicon removed by an etch process. In the exemplary embodiment, the silicon layers (i.e. semiconductor layer 12 and layer 15) on the horizontal surfaces parallel to the SOI wafer surface in structure 100 but, not under layer 14 are removed. The horizontal surfaces include the top surface of structure 100 not covered by layer 14 and the top surface of layer 14. A standard anisotropic etch process such as a reactive ion etch (RIE) removes the re-crystallized silicon of layer 15 and semiconductor layer 12 under layer 15 on the horizontal surfaces of structure 100 including the top surface of layer 14. In an embodiment, another etch process may be used to selectively remove layer 15 and semiconductor layer 12 from the horizontal surfaces on structure 100 and on the top surface of layer 14. After removing layer 15 and layer 12 from the exposed horizontal surfaces, semiconductor layer 12 remains under layer 14. Layer 14 has layer 15 on its vertical surfaces or around the sides of layer 14.

Figure 5:
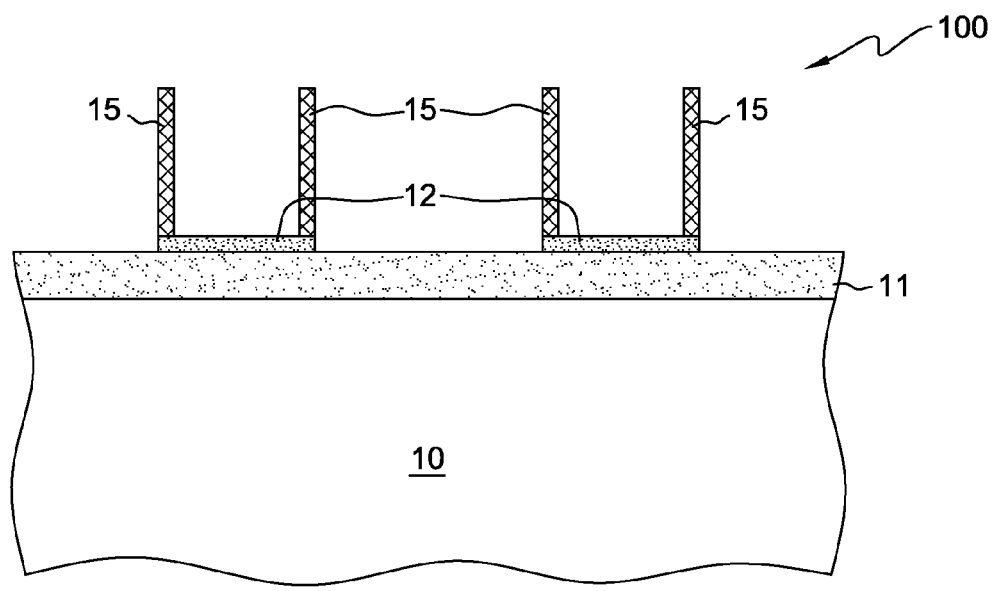
FIG. 5 depicts a cross-sectional view of the structure after a fabrication step to remove the first dielectric layer following the step illustrated in FIG. 4, in accordance with an embodiment of the present invention.

FIG. 5 depicts a cross-sectional view of the structure 100 after fabrication steps to remove layer 14 in accordance with an embodiment of the present invention. As depicted, FIG. 5 includes handling wafer 10, BOX 11 and the vertical sections of layer 15 and bottom sections of semiconductor layer 12 where the remaining portions of layer 14 have been removed. In the exemplary embodiment, the remaining portions of layer 14 are removed from structure 100 using a conventional etch process. For example, a wet chemical etch, RIE, or other suitable etch process may be used to remove layer 14. Upon removal of the patterned shapes or remaining portions of layer 14, the vertical elements or fins composed of layer 15) (i.e. silicon or other semiconductor material) remain. For each patterned shape or remaining rectangular portion of layer 14 removed, two vertical sections or fins of layer 15 are formed connected by a portion of semiconductor layer 12.

Figure 6:
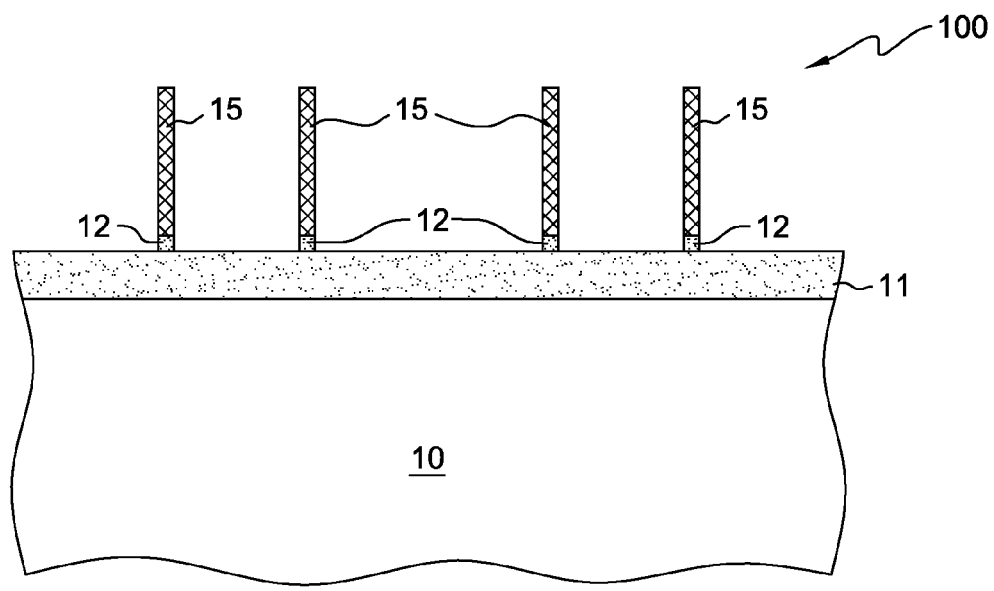
FIG. 6 depicts a cross-sectional view of the structure after a fabrication step to remove remaining horizontal semiconductor layers and form fins following the step illustrated in FIG. 5, in accordance with an embodiment of the present invention.

FIG. 6 depicts a cross-sectional view of structure 100 after fabrication steps to remove remaining horizontal semiconductor layers in accordance with an embodiment of the present invention. As depicted, FIG. 6 includes handling wafer 10, BOX 11, and the vertical fins formed by layer 15 and a small section or portion of semiconductor layer 12 under layer 15. In the exemplary embodiment, the horizontal portions of semiconductor layer 12 connecting two fins are removed using an etch process such as an anisotropic etch. For example, an RIE may be performed to remove the horizontal portions of semiconductor layer 12 on BOX 11. In the exemplary embodiment, the fins remaining on structure 100, depicted as the vertical elements on BOX 11 in FIG. 6, are composed of re-crystallized silicon (i.e. layer 15) and the ultra-thin layer of silicon (i.e. semiconductor layer 12). In one embodiment, the fins are composed of another suitable semiconductor material. In an embodiment, the fins composed of layer 15 which includes the small portion of semiconductor layer 12 may have a height of five to twenty nanometers but, are limited to this height range. In another embodiment, the fins have a height greater than twenty nanometers.

Figure 7:
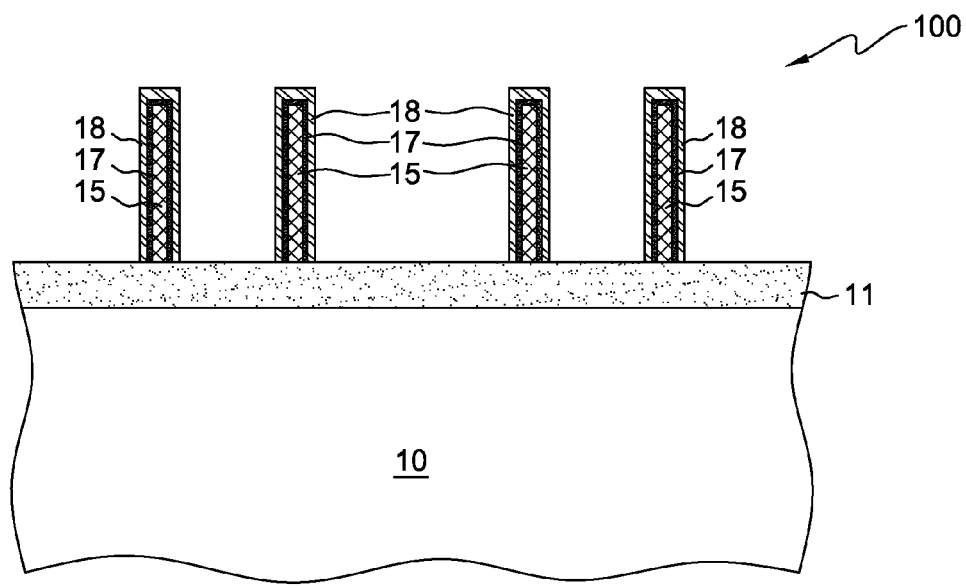
FIG. 7 depicts a cross-sectional view of the structure after a fabrication step to form a gate around the formed fins following the step illustrated in FIG. 6, in accordance with an embodiment of the present invention.

FIG. 7 depicts a cross-sectional view of structure 100 after fabrication steps to form a gate around the fins in accordance with an embodiment of the present invention. As depicted, FIG. 7 includes handling wafer 10, BOX 11, layer 15 forming vertical fins which may be known as the fins composed of layer 15, layer 17, and gate 18. For discussion purposes, since semiconductor layer 12 and layer 15, the re-crystallized amorphous silicon, both are silicon in the exemplary embodiment with essentially the same lattice structure after re-crystallization, the portion of semiconductor layer 12 remaining in the vertical fin and layer 15 will both be called layer 15. Similarly, for discussion in preceding drawings and/or FIG. discussions, the re-crystallized amorphous silicon and the semiconductor layer (i.e. layer 12) will be considered the same semiconductor material when they are the vertical fins with the same material and crystal lattice structure in the other embodiments of the present invention.

A conformal gate dielectric layer, layer 17, may be deposited on the top and sides of the vertical fins composed of layer 15, and on BOX 11 using a suitable deposition technique including, but not limited to chemical vapor deposition (CVD), plasma enhanced chemical vapor deposition (PECVD), atomic layer deposition (ALD), physical vapor deposition (PVD), or other similar deposition processes. In the exemplary embodiment, ALD is used for gate dielectric deposition. In another embodiment, CVD is used for depositing layer 17. Layer 17 may be composed of any appropriate gate dielectric material. In an embodiment, $SiO_2$ may be used as a gate dielectric. In an exemplary embodiment, layer 17 may be composed of high-k dielectric materials which may have a relative dielectric constant greater than four such as $HfO_2$. For example, $ZrO_2$, $Al_2O_3$, $TiO_2$, $LaAlO_3$, $HfSiO_2$, $SrTiO_3$, $Y_2O_3$, or other similar dielectric material may be used as the gate dielectric material in layer 17.

In the exemplary embodiment, a gate electrode layer depicted as gate 18 is deposited on the gate dielectric layer (i.e. layer 17). The gate electrode layer or gate 18 may be deposited by a known deposition method such as MBE, CVD, PECVD, ALD, PVD or other similar deposition methods. Gate 18 may be any suitable conductive material for a gate electrode. In the exemplary embodiment, the gate electrode formed from gate 18 may be composed of titanium nitride. In an embodiment, the gate electrode may be composed of one of the following metals: tungsten, tantalum, tantalum nitride, platinum, or gold. In another embodiment, the gate electrode or gate may be composed of other conductive materials, for example, polysilicon, polysilicon germanium, polygermanium, conductive metal alloys, conductive nitrides, conductive oxides, and similar conductive materials or combination of conductive materials or layers. In some embodiments, the gate or gate electrode consisting of polysilicon, polysilicon germanium, or polygermanium may be doped with doping materials such as aluminum, boron, arsenic, phosphorous, antimony, gallium, or mixtures thereof.

After gate dielectric layer 17 and gate 18 are deposited, a selective etch using, for example, RIE and a mask may be used to selectively remove gate dielectric layer 17 and gate 18 from the top of BOX 11 and from portions of layer 15. A portion of dielectric layer 17 and gate 18 remain wrapped over a portion of layer 15 forming a vertical fin which includes a gate dielectric layer and a gate. In one embodiment, more than one gates or multiple gates are formed over each vertical fin (i.e. fin 15). The multiple gates include gate dielectric layer 17 underneath layer 18 to form the one or more gates. While the gate composed of gate 18 over gate dielectric layer 17 may be formed by any suitable gate formation process or method, in the exemplary embodiment, a process using a gate last process or replacement metal gate process is used to form the gate from gate 18 with gate dielectric layer 17 under it. However, another process such as a gate first process may be used in another embodiment.

Upon completion of the vertical fins which may be wrapped with one or more gates formed from gate 18 with gate dielectric layer 17 present between gate 18 and layer 15, a finFET device may be formed using known processes for source and drain formation such as ion implantation and contact formation. In the exemplary embodiment, a source, a drain, and one or more contacts are formed in the fin to create a finFET device. In an embodiment, more than one of the following may be formed: source, drain and contacts may be formed on a vertical fin (i.e. layer 15 with layers 17 and 18 covering it) to form a finFET device. Conventional back-end of the line (BEOL) processes may be used to complete the finFET device and semiconductor chip or SOI wafer connections.

Figure 8:
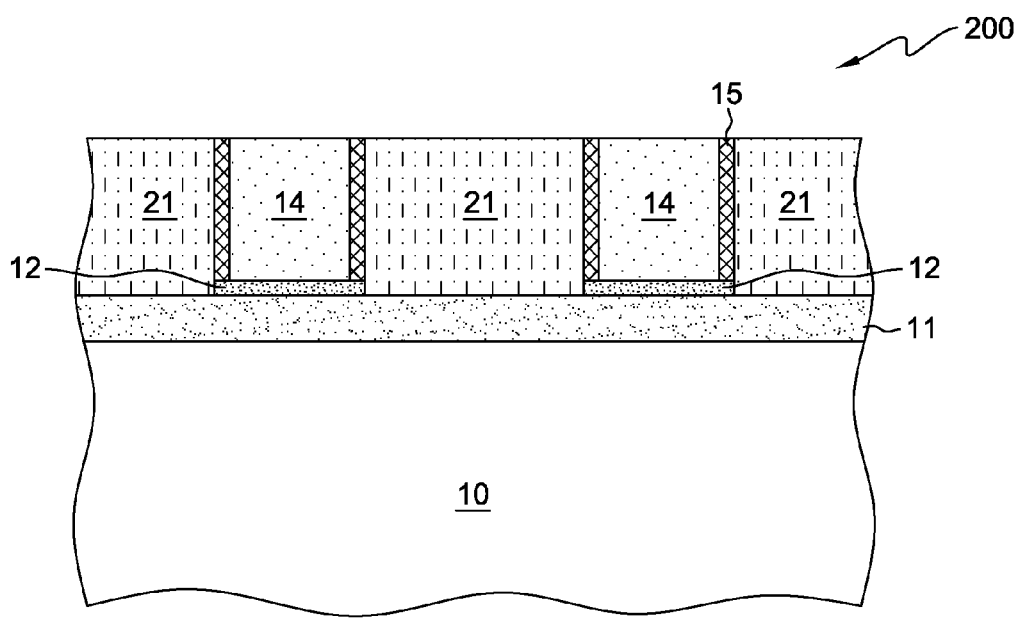
FIG. 8 depicts a cross-sectional view of the structure after fabrication steps of FIGS. 1-4 and deposition of a second material layer in accordance with a first alternate embodiment of the present invention.

FIG. 8 depicts a cross-sectional view of structure 200 after fabrication steps of FIGS. 1-4 and deposition of a second material layer in accordance with a first alternate embodiment of the present invention. As depicted, FIG. 8 includes handling wafer 10, BOX 11, layer 14, semiconductor layer 12, layer 15, and layer 21. FIG. 8 follows the steps depicted in FIGS. 1, 2, 3, and 4 and is a part of the method used to form a fin for a semiconductor device such as a finFET device in another embodiment of the present invention. The second material layer is a second dielectric material, layer 21, and is deposited on BOX 11, layer 14 (deposited and patterned in the steps of FIGS. 1, 2, 3, and 4), layer 15 (deposited, re-crystallized and etched in the steps of FIGS. 1, 2, 3, and 4), and adjacent to layer 15 and semiconductor layer 12 edges using conventional methods such as CVD, PVD, ALD, or another suitable deposition process. In the exemplary embodiment, layer 21 is a second dielectric material. For example, layer 21 may be composed of an oxide material such as silicon dioxide but, is not limited to oxide materials. In one embodiment, layer 21 is composed of another material such as an electrically conducting material. After deposition of layer 21, a planarization of the surface using a chemical mechanical polish (CMP) removes layer 21 from the top surface of layer 14 and layer 15. In other words, layer 14 which may be a nitride material may be used as an etch stop for the CMP process. The top surface of structure 200 exposes layer 21, layer 14 and a small portion of a cross-section of layer 15.

Figure 9:
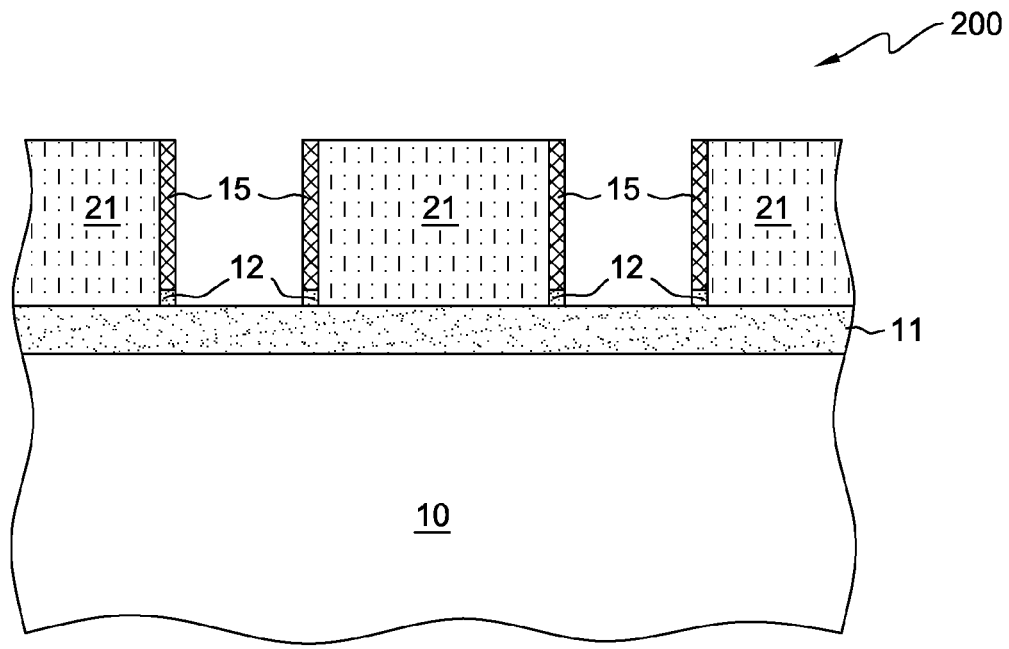
FIG. 9 depicts a cross-sectional view of the structure after a fabrication step to remove the first dielectric layer and a portion of a semiconductor layer following the step illustrated in FIG. 8, in accordance with the first alternate embodiment of the present invention.

FIG. 9 depicts a cross-sectional view of structure 200 after fabrication steps to remove the first dielectric material layer, layer 14 and a portion of the semiconductor layer, layer 12 in accordance with the first alternate embodiment of the present invention. As depicted, FIG. 9 includes handling wafer 10, BOX 11, layer 21, layer 15, a portion of semiconductor layer 12 under layer 21, and a small portion of semiconductor layer 12 under the remaining portion of layer 15. The remaining portion of layer 15 and the small portion of semiconductor layer 12 will form the fin for a semiconductor device such as a finFET upon the completion of later processing steps. Layer 14 and a portion of semiconductor layer 12 under layer 14 may be removed using conventional selective etch processes such as a wet etch or an anisotropic etch such as RIE or an anisotropic wet etch.

Figure 10:
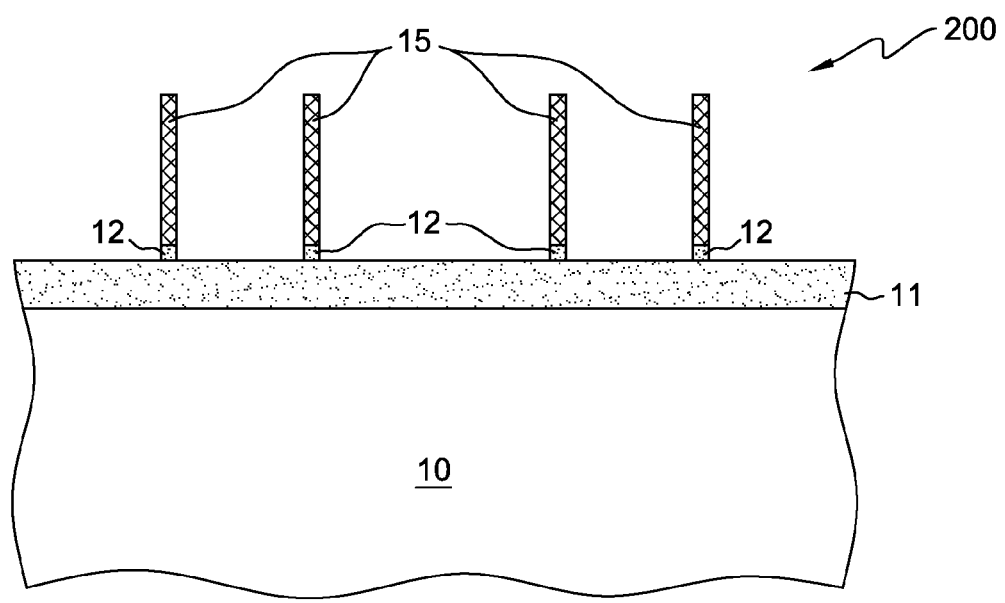
FIG. 10 depicts a cross-sectional view of the structure after a fabrication step to remove the second material layer following the step illustrated in FIG. 9, in accordance with the first alternate embodiment of the present invention.

FIG. 10 depicts a cross-sectional view of structure 200 after fabrication steps to remove the second material layer, layer 21, in accordance with the first alternate embodiment of the present invention. As depicted, FIG. 10 includes handling wafer 10, BOX 11, and the vertical fins composed of a small portion of semiconductor layer 12 and a portion of layer 15. In the exemplary embodiment, the second dielectric material, layer 21, is removed from structure 200 using a conventional etch process and the portion of semiconductor layer 12 under layer 21 is removed. For example, an etch process such as a wet etch or RIE may be used to remove the remaining portions of layer 21. Once layer 21 is removed, the vertical fins composed of a small portion of semiconductor layer 12 and the vertical portion of layer 15 on BOX 11 remain on structure 200. In an embodiment, the vertical fins may be slightly curved where semiconductor layer 12 meets BOX 11 on structure 200. The spacing of the vertical fins may be determined by the lithography patterning and processes used to pattern layer 14 where the spacing of the fins is determined by both the size and shape of the patterned portions or areas of layer 14, the open areas where layer 14 is removed, and, in part, by the thickness of layer 15 deposited to form fins. The fins composed of a remaining portion of semiconductor layer 12 and a remaining portion of layer 15 may be placed as close as lithography processes and layer 15 deposition processes allow for the materials selected for layer 14, layer 15 and layer 21.

Upon completion of the fabrication steps discussed in FIG. 10, a gate dielectric layer is deposited using the known materials and processes as discussed in FIG. 7. In an embodiment, one or more gates are formed on the gate dielectric layer as discussed in FIG. 7 using known processes and materials. After gate formation as briefly discussed in FIG. 7, the semiconductor device which is a finFET in the exemplary embodiment, is formed using known finFET processes and methods such as source, drain, and contact formation after formation of one or more gates on the vertical fins formed in the first alternate embodiment from the steps discussed in FIGS. 8-10.

Figure 11:
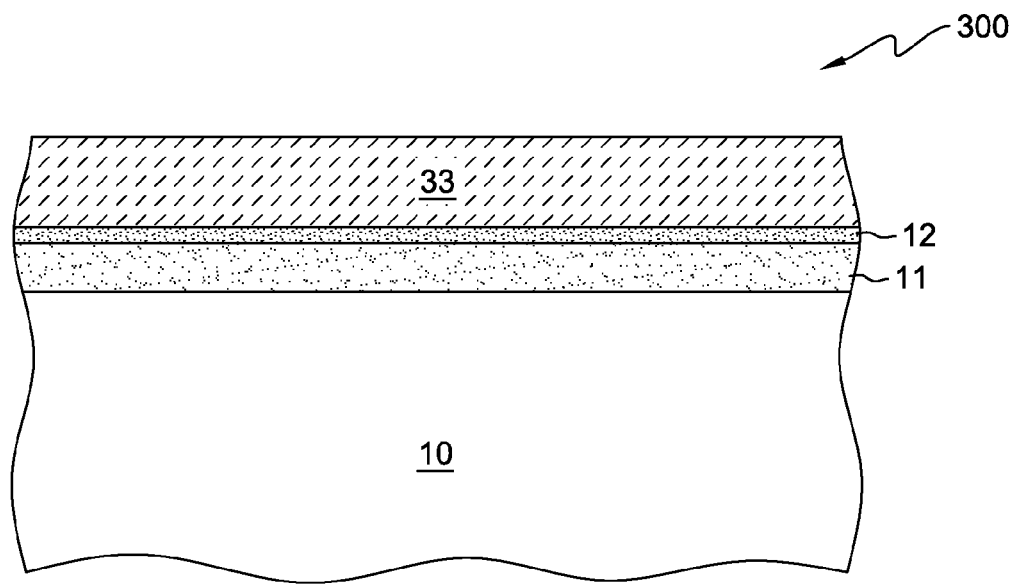
FIG. 11 depicts a cross-sectional view of a structure on a SOI wafer after fabrication steps to deposit a mandrel material in accordance with a second alternate embodiment of the present invention.

FIG. 11 depicts a cross-sectional view of structure 300 after fabrication steps to deposit a mandrel material in accordance with a second alternate embodiment of the present invention. As depicted, FIG. 11 includes handling wafer 10, BOX 11, semiconductor layer 12, and the mandrel material, layer 33. As illustrated, FIG. 11 depicts a step in a method used to create fins for semiconductor devices such as finFETs with the third embodiment of the present invention. In the exemplary embodiment, a mandrel material used in the formation of spacers is deposited on semiconductor layer 12 to form layer 33. For example, layer 33 may be composed of poly silicon although it is not limited to this material. Layer 33 may be made of any material used in mandrels for the formation of spacers, commonly used in semiconductor devices. In an embodiment, layer 33 may be composed of another material not commonly used in mandrels. Layer 33 may be deposited with known deposition processes such as CVD or ALD, for example. The thickness of layer 33 may be in the range of five to fifty nanometers but, is not limited to this range. In one embodiment, the thickness of layer 33 is less than five nanometers. The height of the fins in the finFET device upon completion of later process steps may be largely determined, or determined in part, by the thickness of layer 33 and semiconductor layer 12.

Figure 12:
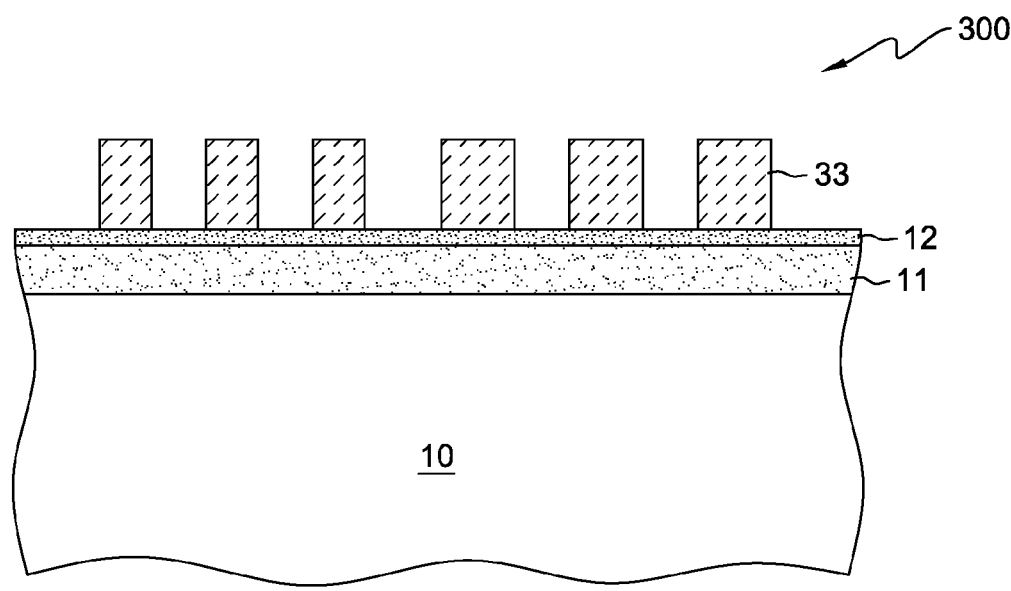
FIG. 12 depicts a cross-sectional view of the structure after a fabrication step to etch the mandrel material following the step illustrated in FIG. 11, in accordance with the second alternate embodiment of the present invention.

FIG. 12 depicts a cross-sectional view of e structure 300 after fabrication steps to etch the mandrel material in accordance with the second alternate embodiment of the present invention. As depicted, FIG. 12 includes handling wafer 10, BOX 11, semiconductor layer 12, and the portions of layer 33 after selective etch. The portions of layer 33 may be created with various sizes and spacing. In the exemplary embodiment, the portions of layer 33 are created using lithography and etch processes. Known etch processes such as wet chemical etch or RIE may be used to form the patterned portions of layer 33. The patterned portions of layer 33 may also be known as or called mandrels, as commonly used in finFET formation, however, these portions of layer 33 or mandrels may be used in a different way or in a different method to form fins for finFETs as will be illustrated and discussed in the later process steps. The width of the mandrels or the width of the portions of layer 33 may be in the range of twenty to sixty nanometers, but is not limited to this range. In one embodiment, the width of the mandrel may be less than 20 microns.

Figure 13:
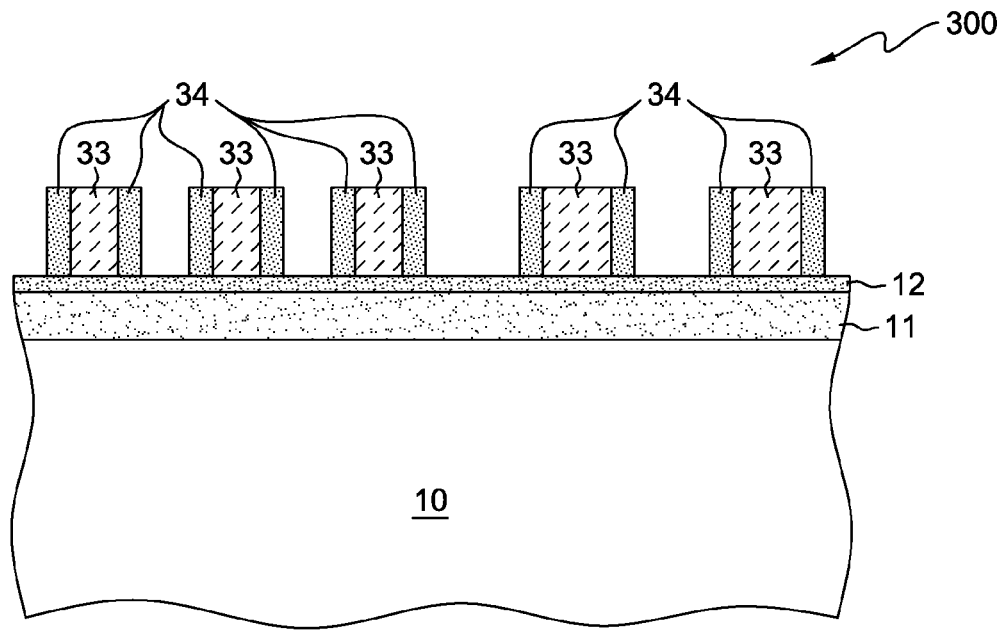
FIG. 13 depicts a cross-sectional view of the structure after a fabrication step to form spacers following the step illustrated in FIG. 12, in accordance with the second alternate embodiment of the present invention.

FIG. 13 depicts a cross-sectional view of the structure 300 after fabrication steps to form spacers in accordance with the second alternate embodiment of the present invention. As depicted, FIG. 13 includes handling wafer 10, BOX 11, semiconductor layer 12, portions of layer 33, and portions of layer 34. In the exemplary embodiment, the spacers composed of portions of layer 34 are formed by a deposition of a spacer material on semiconductor layer 12 and around the mandrel and a conventional spacer etch process to remove the spacer material from the horizontal surfaces of structure 300. The spacers (i.e. layer 34) are formed next to the sidewalls of the mandrel composed of layer 33. For example, the spacer etch process (i.e. etch of layer 34) may be a selective etch or an anisotropic etch such as RIE. The spacer material may be any material suitable to use for forming spacers. In one embodiment, the spacer material used in layer 34 may be a dielectric material such as a nitride (i.e. silicon nitride) however, the spacer material is not limited to this material. However, layer 34 is a different material than layer 33. In the exemplary embodiment, the portions of layer 34 forming the spacers may have a thickness or width in the range of ten to twenty nanometers, but are not limited to this thickness range. The thickness or width of the portions of layer 34 may be the thickness of layer 34 measured horizontally to the surface of structure 300 just above semiconductor layer 12. The spacing of the completed fins as depicted later in FIG. 17 may be determined, in part, by the width of the spacers formed from layer 35.

Figure 14:
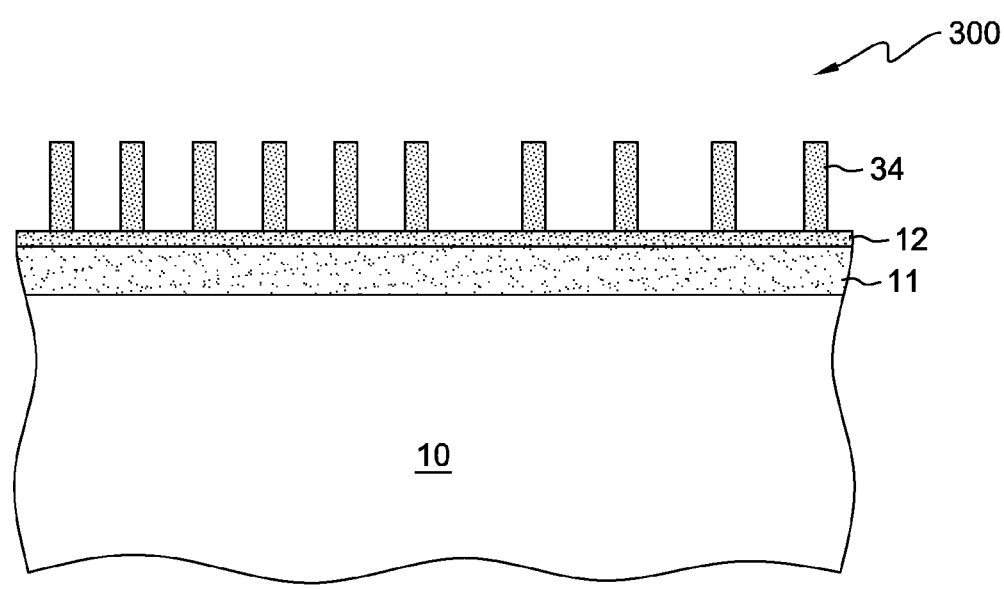
FIG. 14 depicts a cross-sectional view of the structure after a fabrication step to remove mandrel material following the step illustrated in FIG. 13, in accordance with the second alternate embodiment of the present invention.

FIG. 14 depicts a cross-sectional view of structure 300 after fabrication steps to remove mandrel material in accordance with the second alternate embodiment of the present invention. As depicted, FIG. 14 includes handling wafer 10, BOX 11, semiconductor layer 12, and the portions of layer 34 forming the spacers. In the exemplary embodiment, the mandrel material is removed by wet etch or gaseous etch process. For example, a fluorine based wet etch process or a potassium hydroxide gaseous etch process may be used to remove a mandrel formed from polysilicon (i.e. layer 33). The mandrel material of layer 34, for example, polysilicon may be removed, leaving the spacers composed of the material of layer 34. The distance between the various spacers (i.e. layer 34) can be different than depicted and can vary within structure 300.

Figure 15:
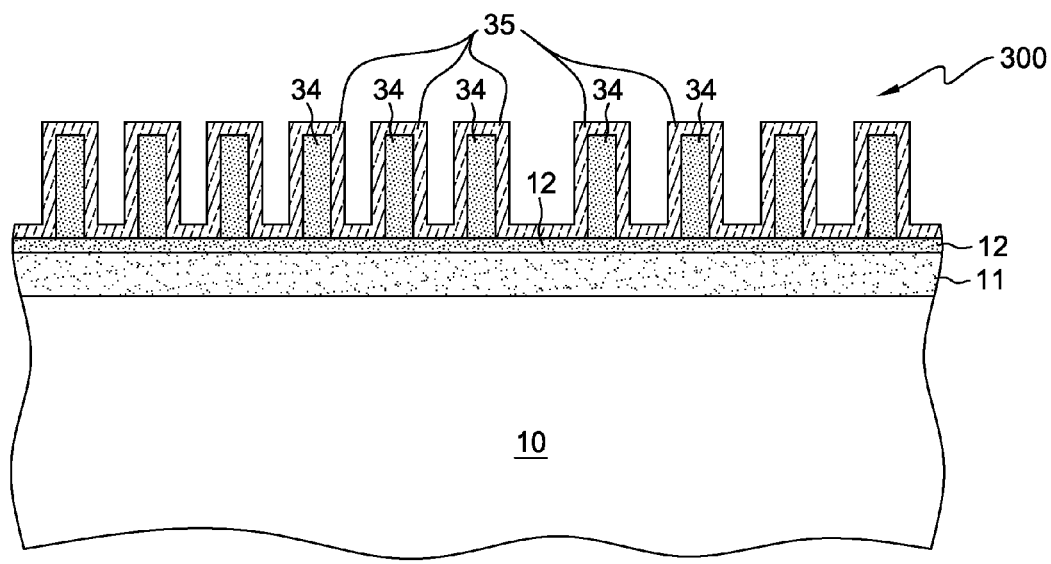
FIG. 15 depicts a cross-sectional view of the structure after a fabrication step to deposit a layer of amorphous silicon and form a layer of re-crystallized silicon following the step illustrated in FIG. 14, in accordance with the second alternate embodiment of the present invention.

FIG. 15 depicts a cross-sectional view of structure 300 after fabrication steps to deposit a layer of amorphous silicon in accordance with the second alternate embodiment of the present invention. As depicted, FIG. 15 includes handling wafer 10, BOX 11, semiconductor layer 12, the portions of layer 34 forming spacers, and layer 35. In the exemplary embodiment, layer 35 is a layer of amorphous silicon deposited on the surface of semiconductor layer 12 and over the spacers formed from layer 34. In another embodiment, layer 35 may be formed from different semiconductor material. In one embodiment, both semiconductor layer 12 and layer 35 are formed from semiconductor materials with the same material composition such as a group IV, group III-V, group II-VI semiconductor material, or other semiconductor material. Layer 35 may be deposited by known deposition techniques such as CVD or ALD, for example, and may have a thickness in the range of five to fifty nanometers although the thickness is not limited to this range. In one embodiment, the thickness of layer 35 is greater than fifty nanometers while in another embodiment, the thickness of layer 35 is less than five nanometers.

In the exemplary embodiment, a solid phase epitaxy re-crystallizes the amorphous silicon of layer 35 when the SOI wafer is heated and held to a temperature for a period of time. For example, layer 35 may be heated to five to six hundred degrees Celsius for ten to thirty minutes. However, the temperature and time that layer 35 is heated to may be changed for a different semiconductor material. As previously discussed in FIG. 6, the re-crystallized semiconductor material such as silicon in layer 35 has the same material composition and a crystal lattice structure corresponding to the lattice structure of semiconductor layer 12 on structure 300 and, therefore, layer 35 and semiconductor layer 12 may be considered the same material from this point. Through solid phase epitaxy, layer 35, formerly an amorphous silicon in the exemplary embodiment, transforms causing layer 35 to develop a lattice structure matching semiconductor layer 12 (i.e. re-crystallizes into a silicon material which is essentially the same as semiconductor layer 12 when re-crystallization is complete). For illustration purposes, both semiconductor layer 12 and layer 35 will identified as layer 35 in FIG. 15, FIG. 16 and FIG. 17 as both semiconductor layers are essentially the same material since both have essentially the same material composition and corresponding lattice structure.

Figure 16:
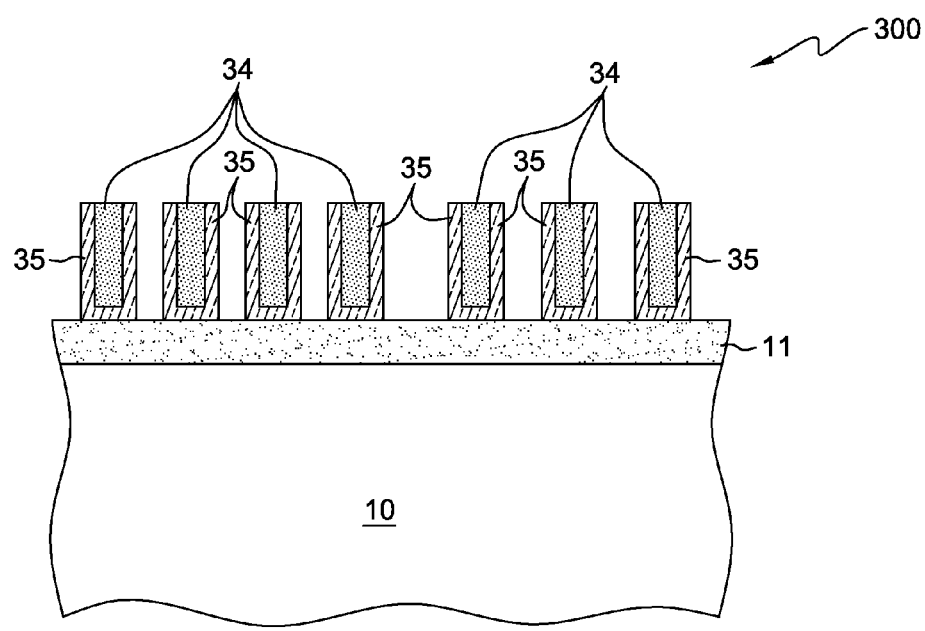
FIG. 16 depicts a cross-sectional view of the structure after a fabrication step to remove a silicon layer from horizontal surfaces following the step illustrated in FIG. 15, in accordance with the second alternate embodiment of the present invention.

FIG. 16 depicts a cross-sectional view of structure 300 after fabrication steps to remove silicon from the horizontal surfaces in accordance with an embodiment of the present invention. As depicted, FIG. 16 includes handling wafer 10, BOX 11, the portions of layer 34 forming the spacers, and the portions of layer 35 (including both semiconductor layer 12 and layer 35 as mentioned above) after removing layer 35 from the horizontal surfaces of structure 300. In the exemplary embodiment, an anisotropic etch is used to remove layer 35 from the horizontal surfaces of structure 300. For example, an RIE etch may be used to remove the silicon of layer 35 from the top of BOX 11 and the top of the spacers (i.e. layer 34). In one embodiment, another etch process may be used to selectively remove layer 35.

Figure 17:
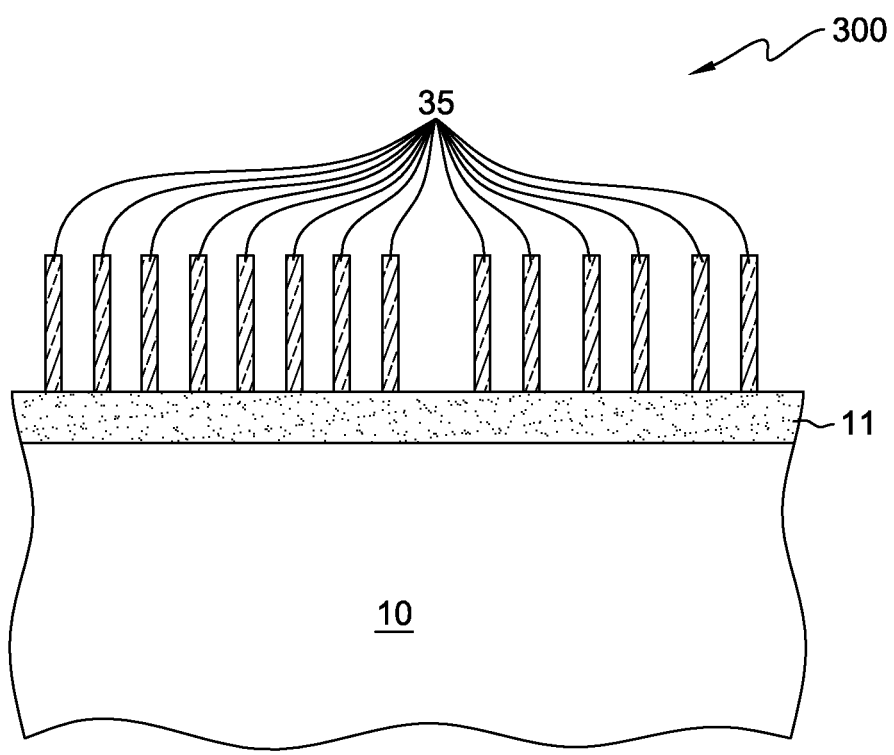
FIG. 17 depicts a cross-sectional view of the SOI wafer after a fabrication step to remove the spacers following the step illustrated in FIG. 16, in accordance with the second alternate embodiment of the present invention.

FIG. 17 depicts a cross-sectional view of structure 300 after fabrication steps to remove the spacers in accordance with an embodiment of the present invention. As depicted, FIG. 17 includes handling wafer 10, BOX 11, and the remaining portions of layer 35 (which include a small portion of semiconductor layer 12 as discussed) forming vertical fins. The spacers composed of layer 34 may be removed with a known etch process such as a wet chemical etch or an RIE. For each of the spacers removed, two vertical fins formed from layer 35 remain. In an embodiment, a selective etch of the layer 34 on one side of the spacer could be done to leave one fin. The pitch or space between the two vertical fins formed around the spacer after removing the spacer may be in the range of five to fifty nanometers although the pitch is not limited to this range. In an embodiment the pitch or the spacing between two fins may be greater than 50 nanometers. In another embodiment, the pitch or the spacing between to two fins may be less than 5 nanometers. Known or conventional finFET processes using spacers to form fins leave only one fin per spacer therefore, the second alternative embodiment of the present invention provides a method for forming fins creating twice as many fins per spacer or, twice the density of fins formed on a spacer or by other conventional finFET processes. Once the remaining portions of layer 34 (i.e. the spacers) are removed, the horizontal portions of layer 35 which were originally known as semiconductor layer 12 on BOX 11 may be removed, for example, by RIE. In one embodiment, an etch process is used to remove both layer 34 and the horizontal portions of layer 35 on BOX 11 by using an anisotropic etch process such as RIE. In an embodiment, the vertical fins formed from layer 35 may have a height of five to twenty nanometers but, are limited to this height. In another embodiment, the vertical fins formed from layer 35 have a height greater than twenty nanometers. In one embodiment, the fin may have a height less than five nanometers.

Upon removal of layer 34 and the horizontal portion of layer 35 (originally, known as semiconductor layer 12 as discussed above), the resulting vertical portions remaining of layer 35 will be the fins. The one or more vertical fins formed may be used for a finFET device after additional conventional finFET semiconductor processes (as discussed in FIG. 7) are complete. The fins created from the vertical portions of layer 35 on BOX 11 with this method may be formed on a small pitch or spacing thus, forming high density fins for semiconductor devices such as finFET devices capable of narrow or small dimensions and that may be closely packed. The vertical portions of layer 35 include a small portion of semiconductor material originally known as semiconductor layer 12 as discussed above. The vertical fins formed around a spacer may have a smaller pitch which may be twice or double the density of fins formed on spacers or by sidewall image transfer techniques. In an embodiment, the fins formed from layer 35 may be slightly curved due to spacer shape (i.e. due to deposition and patterning of layer 34). Additionally, this method of forming fins from the vertical sections of layer 35 allow for varied spacing of fins (i.e. close packed and/or widely spaced) within a wafer or a semiconductor device.

Upon completion of the fabrication steps discussed in FIG. 17, a gate dielectric layer is deposited using the same materials and processes as discussed in FIG. 7 and one or gates are formed as discussed in FIG. 7 using known processes and materials. After gate formation, using the conventional gate dielectric layer deposition and gate formation processes briefly discussed in FIG. 7, a semiconductor device which is a finFET device in the exemplary embodiment, is formed. A source, a drain and contacts such as device contacts are formed on the vertical fins (i.e. depicted as layer 35 in FIG. 17) using known processes and methods for source, drain, and contact formation. In an embodiment, the vertical fins may have one or more of gates, sources and contacts on each fin. In the exemplary embodiment, the vertical fins with a gate, source, drain and contacts or device contacts forms a finFET device.

In some embodiments, the SOI wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, motherboard or (b) end product. The end product can be any product that includes integrated circuit chips, ranging from toys and other low-end applications to advanced computer products having a display, a keyboard or other input device and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming fins for a semiconductor device on a silicon-on-insulator (SOI) wafer, comprising:
   depositing a dielectric layer on a semiconductor layer on the SOI wafer;
   removing one or more portions of the dielectric layer;
   depositing a layer of amorphous semiconductor material around one or more remaining portions of the dielectric layer;
   heating and causing the layer of amorphous semiconductor material to transform into a layer of crystallized semiconductor material through solid phase epitaxy;
   removing portions of the layer of crystallized semiconductor material from one or more top surfaces of the one or more remaining portions of the dielectric layer;
   removing the one or more remaining portions of the dielectric layer, and
   removing the semiconductor layer on the SOI wafer from an area where the one or more remaining portions of the dielectric layer was removed to form one or more fins of the crystallized semiconductor material.

2. The method of claim 1, further comprising:
   depositing a gate dielectric layer on the one or more formed fins, adjacent to the one or more formed fins, and on a top surface of the SOI wafer;
   depositing a gate material layer on the gate dielectric layer; and
   forming, using etching processes, one or more gates on the one or more formed fins.

3. The method of claim 2, further comprising:
   forming one or more of: a source, a drain and a contact on each of the one or more fins; and
   forming a finFET device utilizing the source, the drain and the contact on each of the one or more fins.

4. The method of claim 1, wherein the deposited layer of amorphous semiconductor material and the semiconductor later have a same material composition.

5. The method of claim 1, wherein the deposited layer of amorphous semiconductor material and the semiconductor layer are composed of silicon.

6. The method of claim 1, wherein the layer of crystallized semiconductor material is formed with a same material composition and a same lattice structure as the semiconductor layer of the SOI wafer.

7. The method of claim 1, wherein the one or more fins of the crystallized semiconductor material each have a thickness of five to fifty nanometers.

8. A method for forming fins for a semiconductor device on a silicon-on-insulator (SOI) wafer, comprising:
    depositing a dielectric layer on a semiconductor layer on the SOI wafer;
    removing one or more portions of the dielectric layer;
    depositing a layer of polycrystalline semiconductor material around one or more remaining portions of the dielectric layer, wherein the crystalline semiconductor material includes one of a single crystal semiconductor material and a polycrystalline semiconductor material;
    heating and causing the layer of polycrystalline semiconductor material to transform into a layer of crystallized semiconductor material through solid phase epitaxy;
    removing portions of the layer of crystallized semiconductor material from one or more top surfaces of the one or more remaining portions of the dielectric layer;
    removing the one or more remaining portions of the dielectric layer, and
    removing the semiconductor layer on the SOI wafer from an area where the one or more remaining portions of the dielectric layer was removed to form one or more fins of crystallized semiconductor material.

9. The method of claim 8, wherein the deposited layer of crystalline semiconductor material and the semiconductor layer have a same material composition.

10. The method of claim 8, wherein the layer of re-crystallized semiconductor material includes a same material composition and a same lattice structure as the semiconductor layer on the SOI wafer.

11. The method of claim 8, wherein the one or more fins of the re-crystallized semiconductor material each have a thickness of approximately five to approximately fifty nanometers.

12. The method of claim 8, further comprising:
    depositing a gate dielectric layer on the one or more formed fins, adjacent to the one or more formed fins, and on a top surface of the SOI wafer;
    depositing a gate material layer on the gate dielectric layer; and
    forming, using etching processes, one or more gates on the one or more formed fins.

13. The method of claim 8, wherein the deposited layer of crystalline semiconductor material and the semiconductor layer each include silicon.

14. A method for forming fins for a semiconductor device on a silicon-on-insulator (SOI) wafer, comprising:
    depositing a dielectric layer on a semiconductor layer positioned on the SOI wafer;
    removing one or more portions of the dielectric layer;
    depositing a precursor semiconductor material around one or more remaining portions of the dielectric layer;
    heating and causing precursor semiconductor material to transform into a layer of crystallized semiconductor material through solid phase epitaxy;
    removing portions of the layer of crystallized semiconductor material from one or more top surfaces of the one or more remaining portions of the dielectric layer;
    removing the one or more remaining portions of the dielectric layer, and
    removing the semiconductor layer on the SOI wafer from an area where the one or more remaining portions of the dielectric layer was removed to form one or more fins of the crystallized semiconductor material.

15. The method of claim 14, wherein the precursor semiconductor material comprises one of a single crystal semiconductor material, an amorphous semiconductor material, and a polycrystalline semiconductor material.

16. The method of claim 14, wherein the deposited layer of precursor semiconductor material and the semiconductor layer have a same material composition.

17. The method of claim 14, wherein the layer of crystallized semiconductor material includes a same material composition and a same lattice structure as the semiconductor layer on the SOI wafer.

18. The method of claim 14, wherein the one or more fins of the crystallized semiconductor material each have a thickness of five to fifty nanometers.

19. The method of claim 14, further comprising:
    depositing a gate dielectric layer on the one or more formed fins, adjacent to the one or more formed fins, and on a top surface of the SOI wafer;
    depositing a gate material layer on the gate dielectric layer; and
    forming, using etching processes, one or more gates on the one or more formed fins.

20. The method of claim 14, wherein the deposited layer of crystalline semiconductor material and the semiconductor layer each include silicon.

* * * * *